United States Patent
Barnes et al.

(10) Patent No.: US 10,359,609 B2
(45) Date of Patent: Jul. 23, 2019

(54) SPACER WAFER FOR WAFER-LEVEL CAMERA AND METHOD FOR MANUFACTURING SAME

(71) Applicant: OmniVision Technologies, Inc., Santa Clara, CA (US)

(72) Inventors: George Barnes, Westminster, CO (US); Goran Rauker, Longmont, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/445,400

(22) Filed: Feb. 28, 2017

(65) Prior Publication Data

US 2017/0168270 A1 Jun. 15, 2017

Related U.S. Application Data

(62) Division of application No. 13/293,937, filed on Nov. 10, 2011, now abandoned.

(51) Int. Cl.
*G02B 13/00* (2006.01)
*G03F 7/09* (2006.01)
(Continued)

(52) U.S. Cl.
CPC ....... *G02B 13/0085* (2013.01); *G02B 3/0031* (2013.01); *G02B 3/0056* (2013.01); *G02B 3/0068* (2013.01); *G02B 3/0075* (2013.01); *G02B 7/003* (2013.01); *G03F 7/00* (2013.01); *G03F 7/0005* (2013.01); *G03F 7/0045* (2013.01); *G03F 7/038* (2013.01); *G03F 7/092* (2013.01); *G03F 7/0957* (2013.01); *G03F 7/11* (2013.01); *G03F 7/162* (2013.01); (Continued)

(58) Field of Classification Search
None
See application file for complete search history.

(56) References Cited

U.S. PATENT DOCUMENTS 3,771,872 A 11/1973 Nighingale
4,528,261 A * 7/1985 Hauser .................... G03F 7/161
430/311

(Continued)

FOREIGN PATENT DOCUMENTS

CN 1924628 A 3/2007
CN 102012633 A 4/2011
(Continued)

OTHER PUBLICATIONS

Luo et al., "Releasing SU-8 structures using polystyrene as a sacrificial material", Sens.& Actuat., A, vol. 114 pp. 123-128 (2004).*

(Continued)

*Primary Examiner* — Martin J Angebranndt
(74) *Attorney, Agent, or Firm* — Lathrop Gage LLP (57) ABSTRACT

A spacer wafer for a wafer-level camera, a wafer-level camera including the spacer wafer and a method of manufacturing a spacer wafer include a layer of photoresist being formed over a substrate, the layer of photoresist being exposed to radiation through a mask that defines a spacer geometry for at least one wafer-level camera element. The layer photoresist is developed, such that the layer of photoresist is the spacer wafer for the wafer-level camera.

11 Claims, 10 Drawing Sheets

(51) Int. Cl.
| | |
|---|---|
| *G03F 7/20* | (2006.01) |
| *G03F 7/40* | (2006.01) |
| *G03F 7/30* | (2006.01) |
| *G03F 7/38* | (2006.01) |
| *G03F 7/16* | (2006.01) |
| *G03F 7/004* | (2006.01) |
| *G02B 3/00* | (2006.01) |
| *G03F 7/00* | (2006.01) |
| *G03F 7/11* | (2006.01) |
| *G03F 7/038* | (2006.01) |
| *G03F 7/095* | (2006.01) |
| *G02B 7/00* | (2006.01) |

(52) U.S. Cl.
CPC ............... *G03F 7/168* (2013.01); *G03F 7/20* (2013.01); *G03F 7/30* (2013.01); *G03F 7/38* (2013.01); *Y10T 428/24273* (2015.01); *Y10T 428/24942* (2015.01); *Y10T 428/265* (2015.01); *Y10T 428/31504* (2015.04); *Y10T 428/31511* (2015.04)

(56) References Cited

U.S. PATENT DOCUMENTS

| | | | | |
|---|---|---|---|---|
| 4,871,418 | A | * | 10/1989 | Wittlinger .................. B26F 1/28 438/106 |
| 5,744,219 | A | * | 4/1998 | Tahara .................. G03H 1/0252 428/200 |
| 5,958,469 | A | * | 9/1999 | Richards ............. B29C 33/3842 216/24 |
| 5,977,535 | A | | 11/1999 | Rostoker |
| 6,027,595 | A | | 2/2000 | Suleski |
| 6,096,155 | A | | 8/2000 | Harden |
| 6,124,974 | A | | 9/2000 | Burger |
| 6,324,010 | B1 | | 11/2001 | Bowen |
| 6,669,803 | B1 | | 12/2003 | Kathman et al. |
| 6,765,603 | B2 | | 7/2004 | Border et al. |
| 7,045,089 | B2 | | 5/2006 | Afromowitz |
| 7,088,419 | B2 | | 8/2006 | Dowski, Jr. et al. |
| 7,378,724 | B2 | | 5/2008 | Yu et al. |
| 7,710,667 | B2 | | 5/2010 | Oliver et al. |
| 7,876,417 | B2 | | 1/2011 | Dowski, Jr. et al. |
| 8,059,341 | B2 | | 11/2011 | Lin et al. |
| 8,861,089 | B2 | * | 10/2014 | Duparre ............ H01L 27/14621 359/443 |
| 2003/0189705 | A1 | | 10/2003 | Pardo |
| 2005/0063071 | A1 | * | 3/2005 | Wang .................. G02B 5/1857 359/742 |
| 2007/0010122 | A1 | | 1/2007 | Wang |
| 2007/0029277 | A1 | | 2/2007 | Jacobowitz et al. |
| 2007/0243662 | A1 | | 10/2007 | Johnson et al. |
| 2008/0008894 | A1 | | 1/2008 | Abdo et al. |
| 2008/0136956 | A1 | | 6/2008 | Morris et al. |
| 2008/0225390 | A1 | | 9/2008 | Chang et al. |
| 2009/0034088 | A1 | | 2/2009 | Delaney et al. |
| 2010/0025868 | A1 | | 2/2010 | Louh |
| 2010/0208354 | A1 | | 8/2010 | Okazaki |
| 2011/0032409 | A1 | | 2/2011 | Rossi et al. |
| 2011/0069395 | A1 | | 3/2011 | Lin et al. |
| 2011/0080487 | A1 | | 4/2011 | Venkataraman et al. |
| 2011/0181854 | A1 | | 7/2011 | Ovrutsky et al. |
| 2011/0292271 | A1 | | 12/2011 | Lin et al. |
| 2011/0304930 | A1 | | 12/2011 | Welch |
| 2012/0114780 | A1 | * | 5/2012 | Fawcett .................. B44B 5/028 425/385 |
| 2012/0307139 | A1 | * | 12/2012 | Cheng ..................... G02B 7/02 348/374 |
| 2014/0299587 | A1 | * | 10/2014 | Rudmann ......... H01L 27/14618 219/121.69 |

FOREIGN PATENT DOCUMENTS

| | | | | |
|---|---|---|---|---|
| JP | 62-071313 | * | 4/1987 | .............. H03H 3/02 |
| JP | 2011-059299 | * | 3/2011 | .............. G02B 5/00 |
| KR | 2009077435 | A | 7/2009 | |
| TW | I267150 | | 11/2006 | |
| TW | I289352 | B | 11/2007 | |
| WO | 2004027880 | | 4/2004 | |
| WO | 2008011003 | A2 | 1/2008 | |
| WO | 2008020899 | | 2/2008 | |

OTHER PUBLICATIONS

Lin et al., "A new fabrication process for ultrathick-microfluidic microstructures utilizing SU-8 photoresist", J. Micromech. Microeng., vol. 12 pp. 590-597 (2002).*
Translation of the 3rd Office Action corresponding to Chinese Patent Application No. 201210430686.9; dated Apr. 18, 2016; 9 pages.
Taiwanese Patent Application 101136075 Office Action and translation dated Oct. 30, 2015, 13 pages.
Chinese Patent Application 201210430686.9 Office Action and translation dated Oct. 23, 2015, 19 pages.
Taiwanese Patent Application 101136075 Office Action and translation dated Nov. 29, 2014, 13 pages.
Taiwanese Patent Application 101136075 Office Action and Concise Explanation of Relevance dated Nov. 29, 2014, 13 pages.
Chinese Patent Application 2015022701096160 Office Action with translation dated Mar. 3, 2015, 22 pages.
U.S. Appl. No. 13/296,901 Notice of Allowance dated Jun. 6, 2014, 12 pages.
Brueck, "There Are No Fundamental Limits to Optical Lithography", Spie Press, The International Society for Optical Engineering, vol. V, (2002), pp. 85-109.
Volkel, et al., "Miniaturized Imaging Systems", Elsevier Science B.V., (2003), pp. 461-472.
Pitchumani, et al., "Additive Lithography for Fabrication of Diffractive Optics", Applied Optics, vol. 41, No. 29, (2002), pp. 6176-6181.
U.S. Appl. No. 13/296,901 Office Action dated Feb. 11, 2014, 8 pages.
Translation of the Taiwanese Office Action corresponding to Taiwanese Patent Application No. 101136075, dated Oct. 5, 2016, 3 pages.
Machine Translation of KR 2009077435 A.
Chinese Patent Application No. 201210430686.9, English translation of Office Action dated Jan. 2, 2018, 10 pages.

* cited by examiner

SPACER WAFER FOR WAFER-LEVEL CAMERA AND METHOD FOR MANUFACTURING SAME

RELATED APPLICATIONS

This application is a division of U.S. application Ser. No. 13/293,937 filed Nov. 10, 2011, incorporated herein by reference in its entirety.

BACKGROUND

The present disclosure relates to wafer-level cameras, spacer wafers for wafer-level cameras and methods of manufacturing spacer wafers for wafer-level cameras, and, more particularly, to spacer wafers and methods for manufacturing spacer wafers using photolithographic and microfabrication techniques.

In wafer-level cameras, spacer wafers are typically aligned with a solid substrate, such as a glass wafer, and bonded to the solid substrate using an epoxy. This is commonly done before lenses are fabricated on the solid wafer. This spacer-to-wafer bonding is difficult, since epoxy must be applied between the spacer wafer and the solid wafer, but not in or over any spacer holes. Also, an uneven bond thickness can result in variable spacer thickness.

Conventional spacer wafers for wafer-level cameras can commonly be formed of glass wafers. Spacer wafers are commonly manufactured by drilling holes through the glass wafers. The drilling process is typically carried out by laser cutting, although abrasive water jet cutting, sandblasting, chemical etching or other processes are also possible. Laser drilling is extremely expensive and time consuming. For example, it is not uncommon for 80 percent of the total manufacturing cost of a spacer wafer for a wafer-level camera to be in laser drilling. Laser drilling also involves long lead times. If a new array pitch or hole diameter is required, it may take weeks or longer to procure a spacer. This is especially prohibitive in rapid prototyping of lens designs and development work. Also, in conventional approaches, the possible spacer thicknesses are limited to the available standard glass wafer thicknesses.

SUMMARY

These and other drawbacks of the prior art are overcome by the present disclosure, as described herein in detail.

According to one aspect, the present disclosure is directed to a method of manufacturing a spacer wafer for a wafer-level camera. According to the method, a layer of photoresist is formed over a substrate. The layer of photoresist is exposed to radiation through a mask that defines a spacer geometry for at least one wafer-level camera element. The layer of photoresist is developed, such that the layer of photoresist is the spacer wafer for the wafer-level camera.

According to another aspect, the present disclosure is directed to a wafer-level camera. The wafer-level camera includes an element layer on which at least one element is formed. A spacer wafer is disposed over the element layer. The spacer wafer is formed of a layer of photoresist and defines a spacer geometry for the at least one element.

According to another aspect, the present disclosure is directed to a spacer wafer for a wafer-level camera. The spacer wafer includes a layer of photoresist; and a pattern formed on the layer of photoresist. The pattern defines a spacer geometry for at least one element of the wafer-level camera.

BRIEF DESCRIPTION OF THE DRAWINGS

The foregoing and other features and advantages of the disclosure will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the disclosure. The thicknesses and sizes of layers and other features may be exaggerated for clarity.

DETAILED DESCRIPTION

According to the present disclosure, a spacer wafer for a wafer-level camera is created directly on a substrate or glass wafer by a photolithographic and microfabrication process. Alternatively, according to the present disclosure, a standalone spacer wafer is produced by forming the spacer wafer on a sacrificial material layer, such as polypropylene or wax, using a photolithographic and microfabrication process, and then removing the sacrificial material, leaving the standalone spacer wafer.

According to exemplary embodiments, the material of which the spacer wafer is formed is a positive or negative photoresist. For example, in some particular embodiments, the material is SU-8 photoresist. SU-8 is a commonly used epoxy-based negative photoresist. It is a very viscous polymer that can be spun or spread over a thickness ranging from less than 1.0 μm up to greater than 300 μm and can still be processed with standard contact lithography. It can be used to pattern high-aspect-ratio, e.g., greater than 20, structures. Its maximum absorption is for ultraviolet light with a wavelength of 365 nm. When exposed, long molecular chains of SU-8 cross link, causing the solidification of the material.

SU-8 was originally developed as a photoresist for the microelectronics industry, to provide a high-resolution mask for fabrication of semiconductor devices. Photoresist SU-8 is highly transparent in the ultraviolet region, allowing fabrication of relatively thick, i.e., hundreds of micrometers, structures, with nearly vertical side walls. After exposure and developing, its highly cross-linked structure gives it high stability to chemicals and radiation damage. Cured cross-linked SU-8 shows very low levels of outgassing in a vacuum. However, it is very difficult to remove, and tends to outgas in an unexposed state.

It should be noted that SU-8 photoresist is described herein as a material used to make the spacer wafers of the disclosure. SU-8 is an exemplary embodiment only. According to the disclosure, other positive or negative photoresists can be used.

In wafer-level cameras, the term "lens in a pocket (LIAP)" refers to a lens that is fabricated on a substrate such as a glass wafer in the hole of a spacer wafer after the spacer wafer has been fabricated and bonded to the substrate. The spacer wafer and the substrate are typically made of glass, and the spacer wafer is typically formed with an array or pattern of through holes, which are formed by, for example, laser drilling of the glass spacer wafer. The wafer and spacer wafer are aligned and bonded together using an epoxy bonding material. The array of holes is aligned such that optical elements, e.g., lenses, can be formed in the glass substrate within the holes in the spacer wafer. A thickness of the spacer wafer may define a spacing between a first element and a second element of the wafer-level camera. The first and second elements may be a lens and a sensor.

Figure 1:
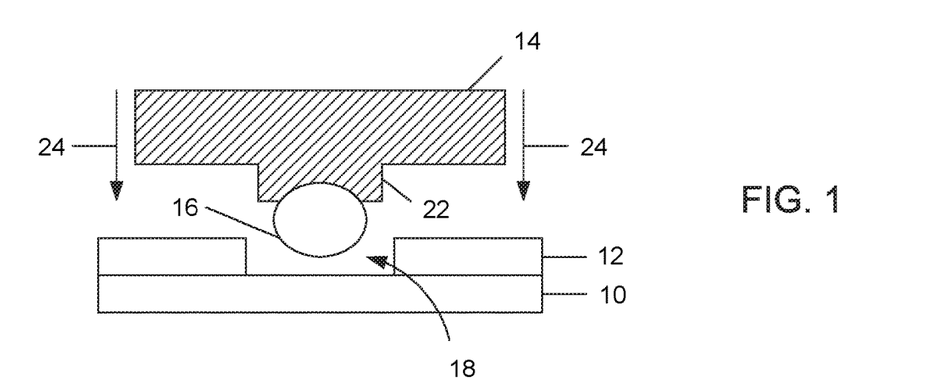
FIG. 1 contains a schematic cross-sectional diagram of fabrication of a lens in a pocket structure.

FIG. 1 contains a schematic cross-sectional diagram of the fabrication of a "lens in a pocket." Referring to FIG. 1, a wafer or substrate 10 is made of, for example, glass. A spacer wafer 12, made of a material such as, for example, glass, is bonded to the wafer or substrate 10. As noted above, spacer wafer 12 can be bonded to glass wafer or substrate 10 by a material such as epoxy. Spacer wafer 12 forms at least one through hole 18 in which a lens 16 is to be formed. Typically, spacer wafer 12 will form an array of through holes such that a plurality of lenses 16 can be formed on wafer or substrate 10.

Lens 16 is typically formed on the top surface of wafer or substrate 10 by a tool 14, which is commonly made of polydimethylsiloxane (PDMS), which is a silicon-based polymer. Lens 16 is commonly made of an optical material such as, for example, a UV-curable lens polymer such as epoxy. The lens polymer is molded or stamped on the top surface of wafer or substrate 10 by a concave protrusion 22 of PDMS tool 14 being lowered toward the top surface of wafer or substrate 10, as indicated by arrows 24.

A lens plate is an optical structure which typically includes a substrate such as a glass wafer on which lenses have already been formed, in contrast to the lens-in-a-pocket structure described above in which lenses are formed on the substrate in holes in a spacer wafer after the spacer wafer is bonded to the substrate. The lenses may have been formed on the substrate by some known process of forming lenses, such as, for example, nanoimprint lithography via PDMS tooling, laser ablation, etc.

Figure 2:
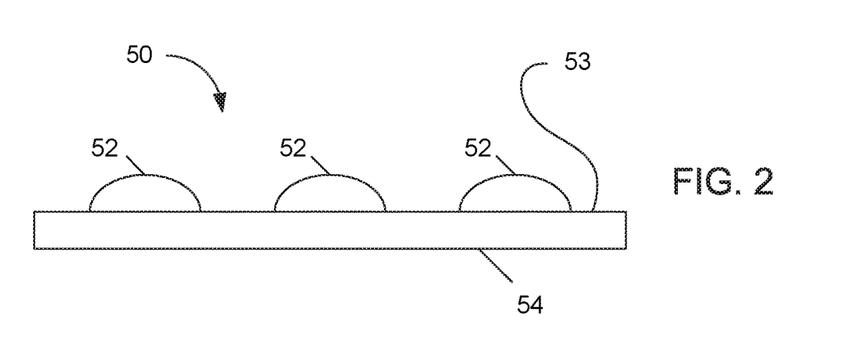
FIG. 2 contains a schematic cross-sectional diagram of a lens plate.

FIG. 2 contains a schematic cross-sectional diagram of a lens plate 50. As shown in FIG. 2, lens plate 50 includes one or more lenses 52 formed on a top surface 53 of a substrate 54 such as a glass wafer. The present disclosure is applicable to the formation of a spacer wafer onto a single-sided lens plate, as illustrated in FIG. 2. As described in detail below, the disclosure is also applicable to the formation of multiple spacer wafers, e.g., two spacer wafers, on a double-sided lens plate. The present disclosure is also applicable to the formation of spacer wafers on a substrate in which no elements have been formed, i.e., an empty substrate. It should be noted that the disclosure is applicable to other features in addition to lenses, such as, for example, fiducial markings.

Figure 3:
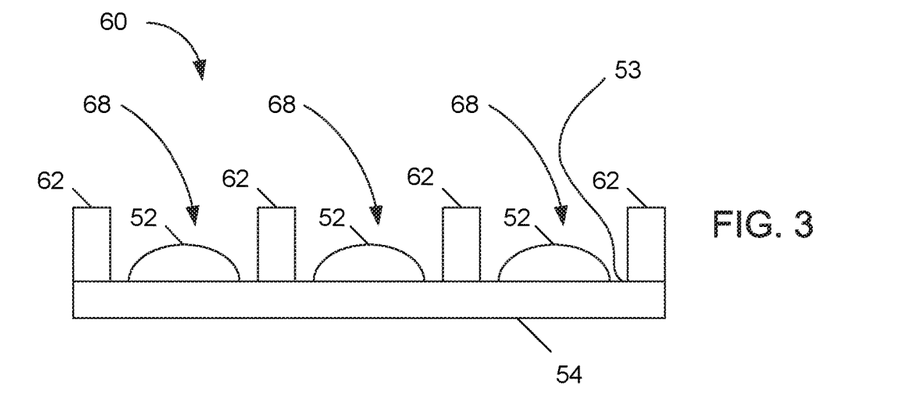
FIG. 3 contains a schematic cross-sectional diagram of a lens plate having a spacer wafer which has been formed on the top surface of the lens plate, according to exemplary embodiments.

FIG. 3 contains a schematic cross-sectional diagram of a lens plate having a spacer wafer which has been manufactured by photolithography and microfabrication techniques onto the top surface of the lens plate, according to exemplary embodiments. Referring to FIG. 3, a device or structure 60 includes lens plate 50 (see FIG. 2) including substrate 54 with lenses 52 and/or other features such as fiducial markings formed thereon. According to the disclosure, substrate 54 of lens plate 50 has served as the substrate for the photolithography and microfabrication processes used to fabricate a spacer wafer 62. Spacer wafer 62 is fabricated on top surface 53 of substrate 54. Spacer wafer 62 is fabricated around lenses 52 to form a pattern of through holes 68 in spacer wafer 62.

Figure 4:
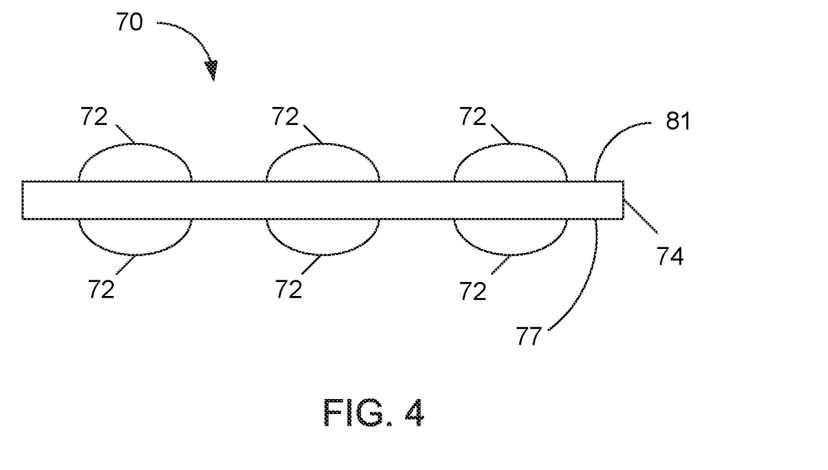
FIG. 4 contains a schematic cross-sectional diagram of a double-sided lens plate.

FIG. 4 contains a schematic cross-sectional diagram of a double-sided lens plate 70. As shown in FIG. 4, double-sided lens plate 70 can include one or more lenses 72, and/or other elements or features such as fiducial markings, formed on either or both surfaces 77, 81 of a substrate 74 such as a glass wafer. As noted above, the present disclosure is applicable to the formation of spacer wafers on both sides of a double-sided lens plate 70, as illustrated in FIG. 4.

Figure 5:
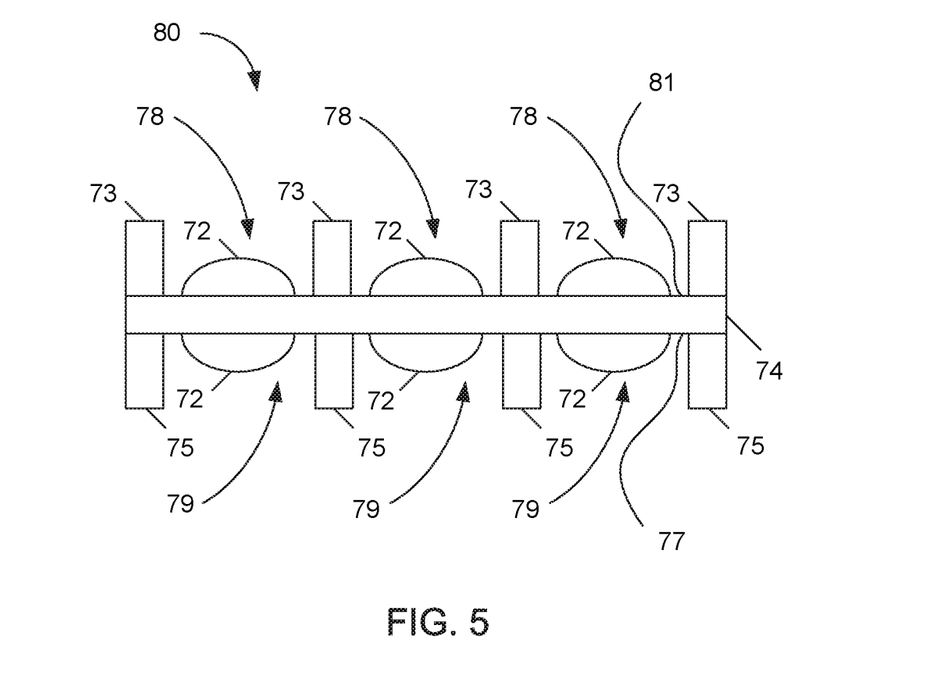
FIG. 5 contains a schematic cross-sectional diagram of a double-sided lens plate having spacer wafers which have been formed on both the top and bottom surfaces of the lens plate, according to exemplary embodiments.

FIG. 5 contains a schematic cross-sectional diagram of a double-sided lens plate having spacer wafers which have been manufactured on both top and bottom surfaces 81, 77, respectively, of lens plate 70, according to exemplary embodiments. Referring to FIG. 5, a device or structure 80 includes lens plate 70 including substrate 74 with lenses 72, and/or other elements or features such as fiducial markings, formed thereon. According to the disclosure, substrate 74 of lens plate 70 has served as the substrate for the photolithography and microfabrication processes used to fabricate spacer wafers 73, 75. The photolithography and microfabrication processes can actually include two sets of photolithography and microfabrication processes, one for each side of lens plate 70. That is, a first set of photolithography and microfabrication processes can be used to form spacer wafer 73 on top surface 81 of substrate 74 of lens plate 70, and a second set of photolithography and microfabrication processes can be used to form spacer wafer 75 on bottom surface 77 of substrate 74 of lens plate 70. According to the present disclosure, spacer wafers 73 and 75 are fabricated around lenses 72 to form patterns of through holes 78 and 79 in spacer wafers 73 and 75, respectively.

According to the present disclosure, spacer wafers 73 and 75 are fabricated directly on top surface 81 and bottom surface 77, respectively, of substrate 74. This is in contrast to conventional approaches to double-sided lens plates with spacer wafers in which the spacer wafers are bonded to both sides of a glass substrate. In the conventional approach, to make a double-sided spacer wafer, after the first spacer wafer is bonded, the assembly is flipped over, and epoxy is dispensed on the glass-only side. The second spacer wafer is then aligned to the first spacer wafer and bonded.

According to the disclosure, the foregoing description refers to a spacer wafer being formed on a substrate such as a glass wafer on which optical elements such as lenses, fiducial markings, etc., are formed. The present disclosure is also applicable to a standalone spacer wafer, which is not necessarily formed permanently and directly onto a glass substrate. According to this aspect of the disclosure, the spacer wafer can be formed on a sacrificial material instead of the glass substrate used in the embodiments described above in detail.

Figure 6:
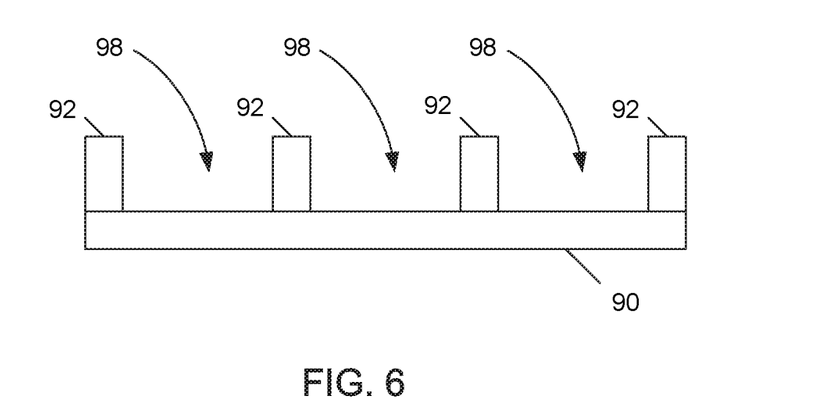
FIG. 6 is a schematic cross-sectional diagram of a spacer wafer formed by a photolithographic and microfabrication process on a sacrificial layer, according to exemplary embodiments.

FIG. 6 is a schematic cross-sectional diagram of a spacer wafer 92 formed by photolithography and microfabrication processes on a sacrificial layer 90, according to exemplary embodiments. As described herein, sacrificial layer 90 takes the place of or is formed over the substrate or glass wafer described above. That is, in this embodiment, spacer wafer 92 is formed on sacrificial layer 90 in the same fashion as the spacer wafer is formed on a glass substrate as described above in detail. Spacer wafer 92 can form an array of through holes 98.

Figure 7:
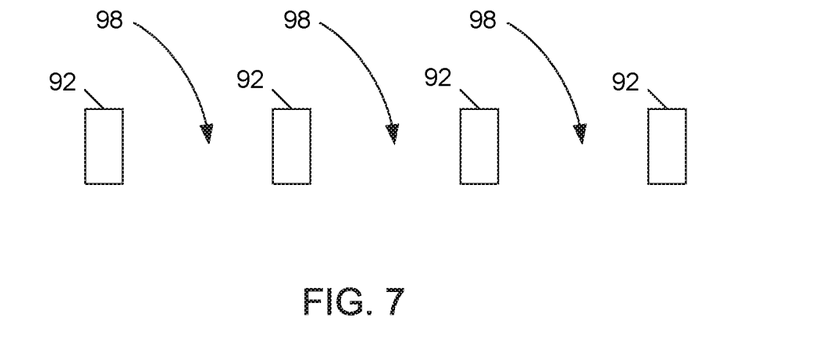
FIG. 7 is a schematic cross-sectional diagram of a standalone spacer wafer which has been removed from a sacrificial layer, according to exemplary embodiments.
Figure 7A:
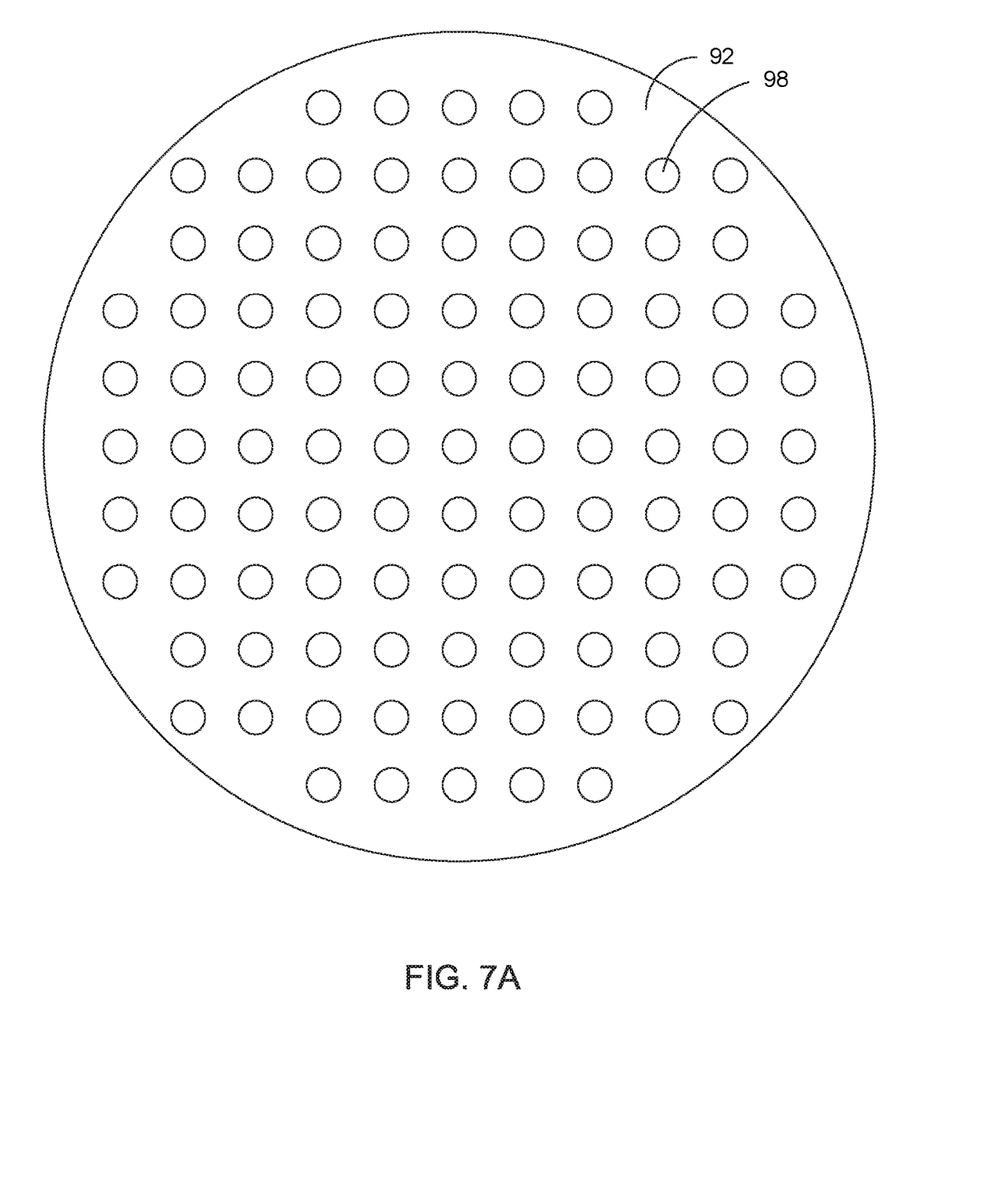
FIG. 7A is a schematic planar view of a portion of a standalone spacer wafer forming through holes, according to exemplary embodiments

In some exemplary embodiments, sacrificial layer 90 is formed of a material which can readily be removed from spacer wafer 92. For example, sacrificial layer 90 can be formed of polypropylene or a wax support material, or other similar readily dissolved and removed support material. FIG. 7 is a schematic cross-sectional diagram of spacer wafer 92 which has been removed from sacrificial layer 90. Sacrificial layer 90 can be removed to release standalone spacer wafer 92 by isopropyl alcohol or other similar material, or by heat. Standalone spacer wafer 92 can form array of through holes 98. For illustration, a planar view of spacer wafer 92 having an array of through holes 98 is schematically shown in FIG. 7A.

Figure 18:
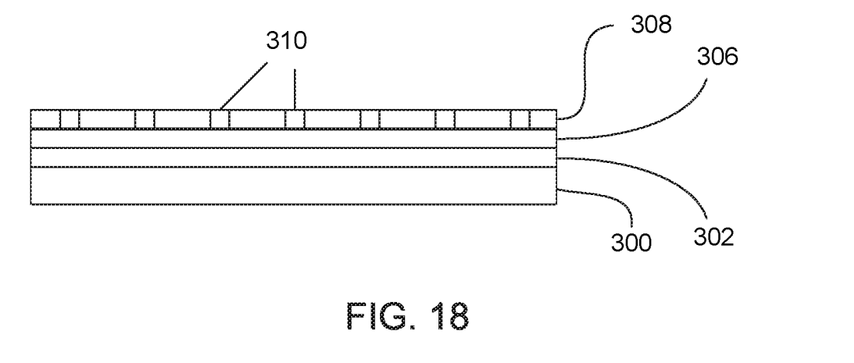
Figure 19:
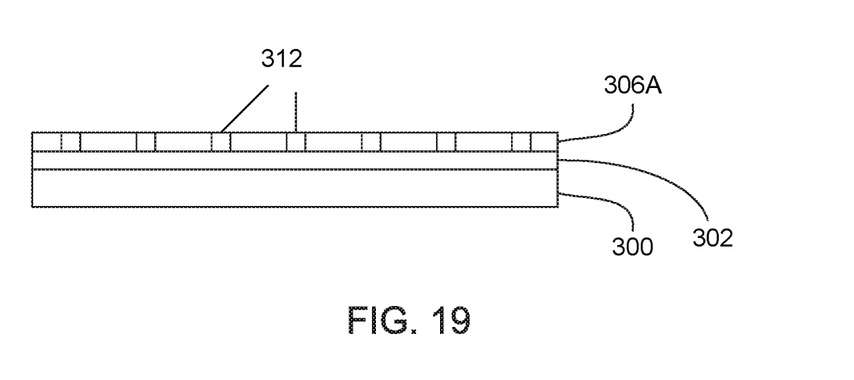
Figure 20:
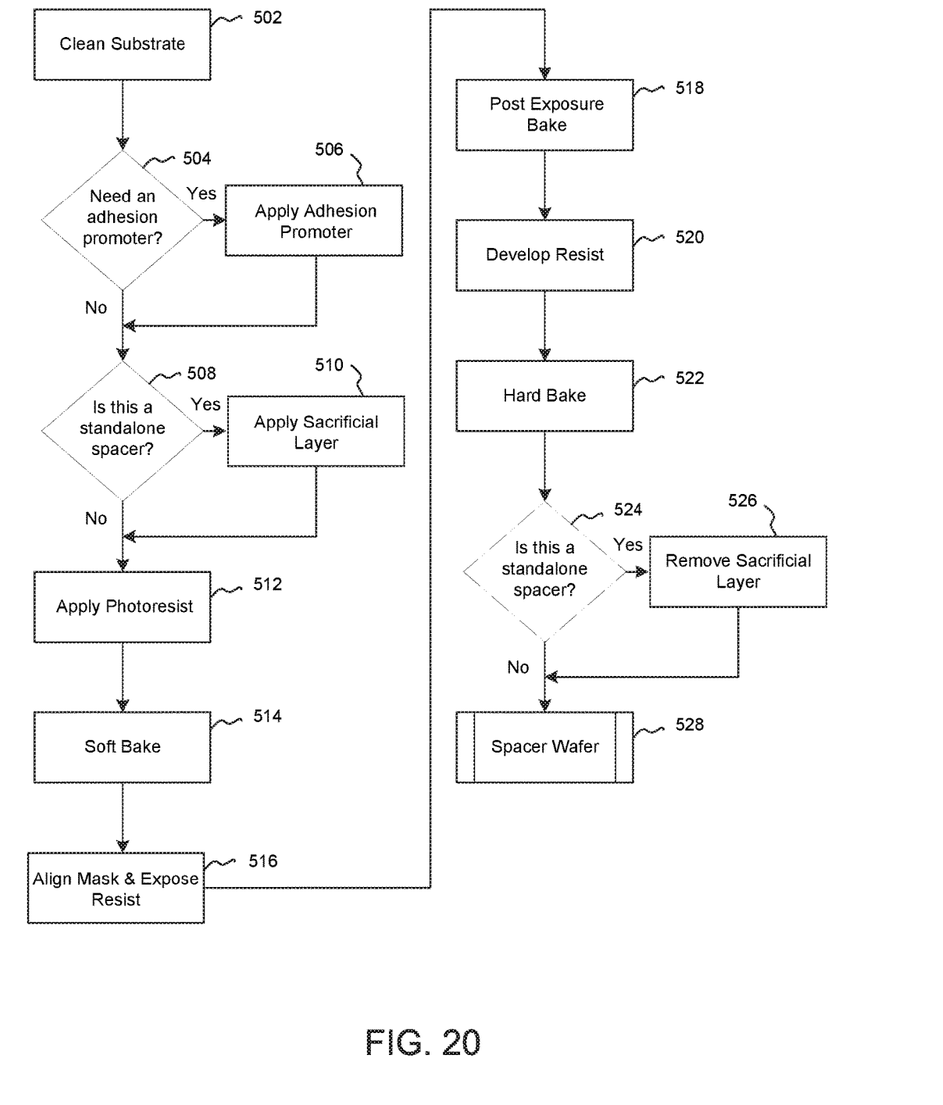
FIG. 20 is a schematic flow diagram illustrating logical flow of photolithography and microfabrication processes used to fabricate spacer wafers for wafer-level cameras, according to some exemplary embodiments.

FIGS. 8-19 are schematic cross-sectional views illustrating steps in photolithography and microfabrication processes used to fabricate spacer wafers for wafer-level cameras, according to some exemplary embodiments. FIG. 20 is a schematic flow diagram illustrating logical flow of photolithography and microfabrication processes used to fabricate spacer wafers for wafer-level cameras, according to some exemplary embodiments.

Figure 8:
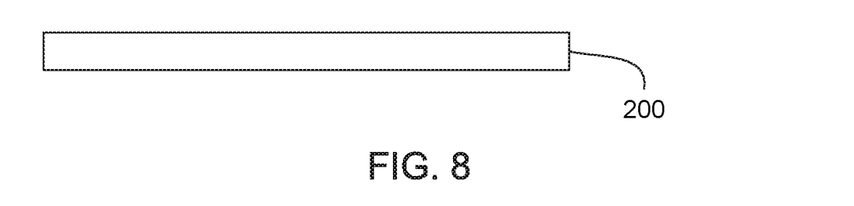
FIGS. 8-19 are schematic cross-sectional views illustrating steps in photolithography and microfabrication processes used to fabricate spacer wafers for wafer-level cameras, according to some exemplary embodiments.

Referring to FIGS. 8 and 20, a substrate 200 such as a glass wafer is provided. According to the disclosure, substrate 200 can be an empty substrate, or substrate 200 may be populated with elements such as, for example, lenses and/or fiducial markings. In step 502, substrate 200 is cleaned.

Figure 9:
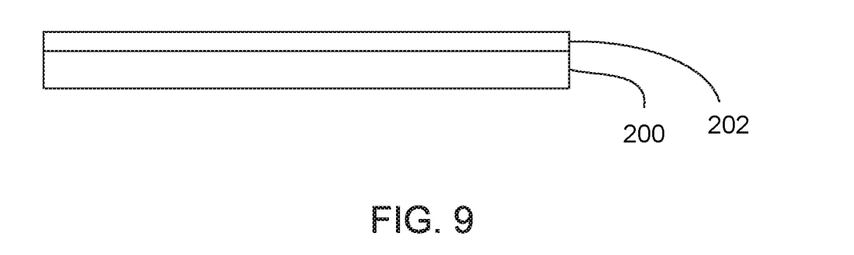

Referring to FIGS. 9 and 20, it is determined in step 504 whether an adhesion promoter layer is to be used. For example, an adhesion promoter layer 202, made of a material such as hexamethyldisilazane (HMDS) or AP300, manufactured and sold by Silicon Resources, Inc. of Chandler, Ariz., USA, may be applied to the top of substrate 200 in step 506. If it is determined that adhesion promoter layer 202 is not to be used, then step 506 is not carried out. It will be understood that although the exemplary embodiments are described and illustrated as including adhesion promoter layer 202, adhesion promoter layer 202 is optional and may be omitted depending on specific requirements, according to the disclosure.

Figure 10:
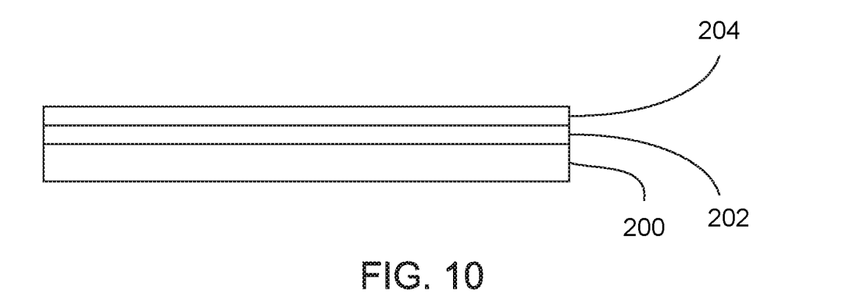

Next, referring to FIGS. 10 and 20, in step 508, it is determined whether the spacer wafer being fabricated is to be formed on and remain attached to substrate 200 or the spacer wafer is to be a standalone spacer wafer. If it is determined that a standalone wafer is being fabricated, then a sacrificial layer 204 is applied over substrate 200 and adhesion promoter layer 202 (if present), in step 510. As described above, in some exemplary embodiments, sacrificial layer 204 is formed of a material which can readily be removed from the spacer wafer. For example, sacrificial layer 204 can be formed of polypropylene or a wax support material, or other similar readily dissolved and removed support material. If it is determined in step 508 that a standalone spacer wafer is not being fabricated, then sacrificial layer 204 is not applied.

Figure 11:
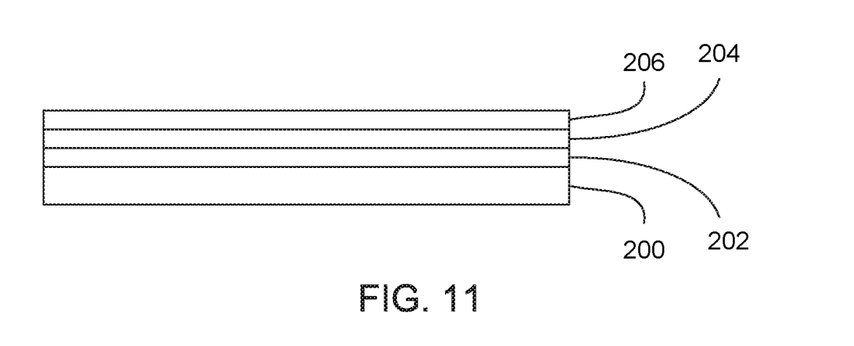

Referring to FIGS. 11 and 20, in step 512, a layer of photoresist 206 can be applied in step 512. As described herein in detail, photoresist 206 can be, for example, SU-8 negative photoresist, or other type of photoresist. Photoresist 206 can be applied via a spin coat on an unpopulated planar substrate. Alternatively, the SU-8 may also be applied via spin coat to a pre-populated substrate. Alternatively, a constant volume injection process can be used to coat a pre-populated, i.e., one containing lenses, fiducials, etc., or an empty unpopulated substrate. If a constant volume injection process is used to apply photoresist 206, photoresist 206 is planarized after it is applied. In some exemplary embodiments, this can be accomplished by gravity force alone during a soft baking of substrate 200 and photoresist 206 on a well-leveled hot plate. Photoresist 206 is soft baked in step 514.

Figure 12:
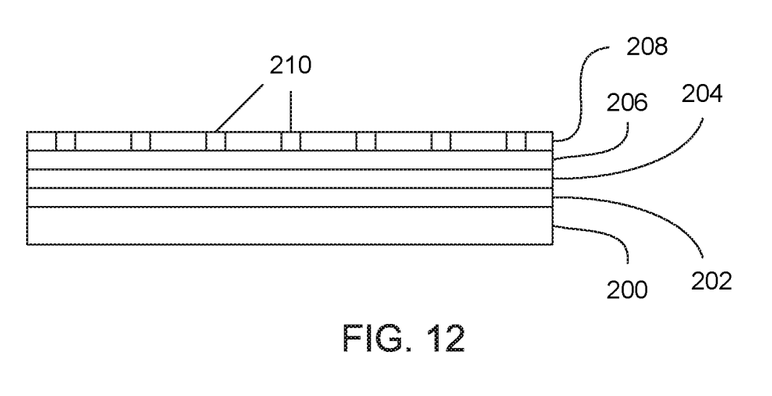

Referring to FIGS. 12 and 20, a photomask 208 is aligned with and applied on top of the structure in step 516. Photomask 208 defines a pattern of features 210 such as holes and/or fiducial markings to be transferred onto and fabricated in photoresist 206 by the photolithography and microfabrication processes according to the disclosure. Photomask 208 thus defines the spacer geometry. Photomask features 210 can be defined as circular, square, rectangular, diamond-shaped or with any other arbitrary desired shape such that the resulting spacer holes will take on these shapes with vertical sidewalls. Alternatively, photomask features 210 may have non-vertical sidewalls. For example, using gray-tone lithography, the sidewalls of the holes may be tapered.

Figure 13:
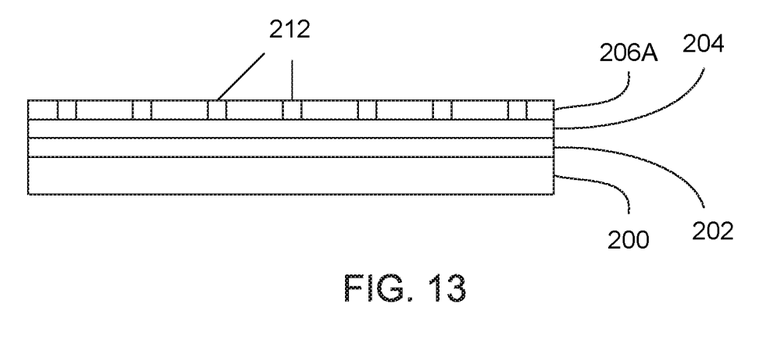

In step 516, after photomask 208 is aligned, photoresist 206 is exposed to cross link photoresist 206. Next, in step 518, the exposed structure is subjected to the post-exposure bake process. Next, in step 520, unexposed photoresist 206 is developed away. Then, in step 522, a hard bake step is carried out. During the hard bake 522, photoresist 206 is further cross linked to ensure good mechanical properties. Referring to FIGS. 13 and 20, with photomask 208 removed, the remaining structure includes a fully patterned and hardened layer of photoresist 206A with a pattern of features 212, i.e., variously shaped holes and fiducial markings, formed in photoresist 206A. Note that fiducial markings in photoresist 206A differ from fiducial markings on substrate 200 described previously.

Figure 14:
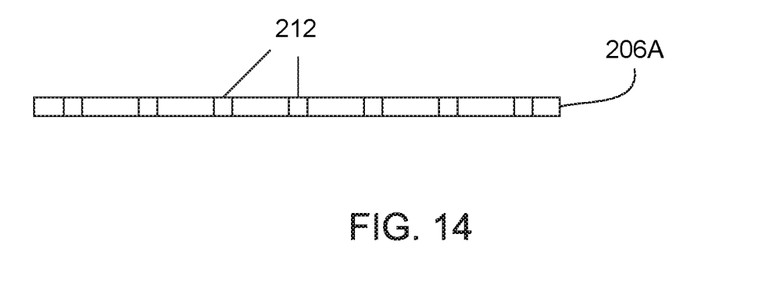

Referring to FIGS. 14 and 20, if a standalone spacer wafer is being fabricated, as determined in step 524, then sacrificial layer 204 is removed in step 528. Sacrificial layer 204 can be removed by, for example, isopropyl alcohol or other similar material, or by heat. After removal of sacrificial layer 204, remaining layer of hardened patterned photoresist 206A remains as the standalone spacer wafer, according to the disclosure.

As described above in detail, FIGS. 8-14 illustrate the process of fabricating a standalone spacer wafer according to the disclosure. As described herein, the disclosure is also applicable to fabrication of a spacer wafer on a substrate. FIGS. 15-19 illustrate fabrication of a spacer wafer on a substrate such as a glass wafer, according to some exemplary embodiments.

Figure 15:
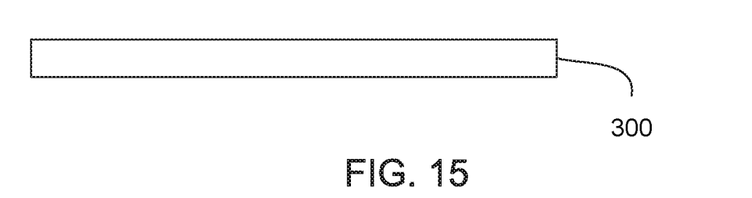

Referring to FIGS. 15 and 20, a substrate 300 such as a glass wafer is provided. According to the disclosure, substrate 300 can be an empty substrate, or the substrate may be populated with elements such as, for example, lenses and/or fiducial markings. In step 502, substrate 300 is cleaned.

Figure 16:
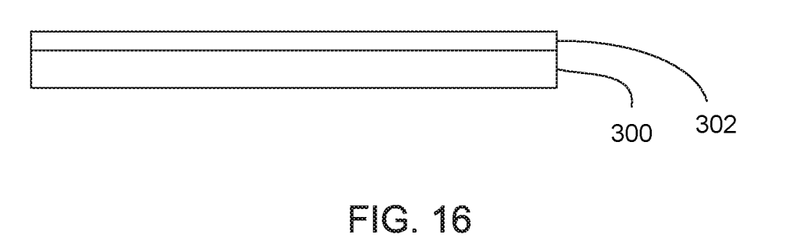

Referring to FIGS. 16 and 20, it is determined in step 504 whether an adhesion promoter layer is to be used. For example, an adhesion promoter layer 302, made of a material such as hexamethyldisilazane (HMDS) or AP300, manufactured and sold by Silicon Resources, Inc. of Chandler, Ariz., USA, may be applied to the top of substrate 300 in step 506. If it is determined that adhesion promoter layer 302 is not to be used, then step 506 is not carried out. It will be understood that although the exemplary embodiments are described and illustrated as including adhesion promoter layer 302, adhesion promoter layer 302 is optional and may be omitted depending on specific requirements, according to the disclosure.

In step 508, it is determined whether the spacer wafer being fabricated is to be formed on and remain attached to substrate 300 or the spacer wafer is to be a standalone spacer wafer. If it is determined that a standalone wafer is being fabricated, then a sacrificial layer is applied over the substrate and adhesion promoter layer 302 (if present), in step 510. If it is determined in step 508 that a standalone spacer wafer is not being fabricated, then the sacrificial layer is not applied. In the embodiments of FIGS. 15-19, since a standalone spacer wafer is not being fabricated, the sacrificial layer is not formed.

Figure 17:
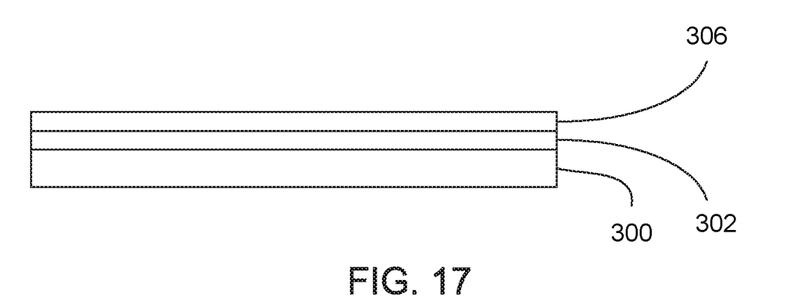

Next, referring to FIGS. 17 and 20, in step 512, a layer of photoresist 306 can be applied in step 512. As described herein in detail, photoresist 306 can be, for example, SU-8 negative photoresist, or other type of photoresist. Photoresist 306 can be applied via a spin coat on an unpopulated planar substrate. Alternatively, the SU-8 may also be applied via spin coat to a pre-populated substrate. Alternatively, a constant volume injection process can be used to coat a pre-populated, i.e., one containing lenses, fiducials, etc., or an empty unpopulated substrate. If a constant volume injection process is used to apply photoresist 306, photoresist 306 is planarized after it is applied. In some exemplary embodiments, this can be accomplished by gravity force alone during a soft baking of substrate 300 and photoresist 306 on a well-leveled hot plate. Photoresist 306 is soft baked in step 514.

Referring to FIGS. 18 and 20, a photomask 308 is aligned with and applied on top of the structure in step 516. Photomask 308 defines a pattern of features 310 such as holes and/or fiducial markings to be transferred onto and fabricated in photoresist 306 by the photolithography and microfabrication processes according to the disclosure. Photomask 308 thus defines the spacer geometry. Photomask features 310 can be defined as circular, square, rectangular, diamond-shaped or with any other arbitrary desired shape such that the resulting spacer holes will take on these shapes with vertical sidewalls. Alternatively, photomask features 310 may have non-vertical sidewalls. For example, using gray-tone lithography, the sidewalls of the holes may be tapered.

In step 516, after photomask 308 is aligned, photoresist 306 is exposed to cross link photoresist 306. Next, in step 518, the exposed structure is subjected to the post-exposure bake process. Next, in step 520, unexposed photoresist 306 is developed away. Then, in step 522, a hard bake step is carried out. During the hard bake 522, photoresist 306 is further cross linked to ensure good mechanical properties. Referring to FIGS. 19 and 20, with photomask 308 removed, the remaining structure includes a fully patterned and hardened layer of photoresist 306A with a pattern of features 312, i.e., variously shaped holes and fiducial markings, formed in photoresist 306A. Note that fiducial markings formed in photoresist 306A differ from fiducial markings on substrate 300, if any are formed. Thus, patterned and hardened layer of photoresist 306A is the spacer wafer of the disclosure formed on substrate 300, according to exemplary embodiments.

According to the present disclosure, the photoresist, e.g., SU-8, is machinable. Accordingly, spacer wafer 62, 73, 75, 92 formed by photolithography and microfabrication processes, whether formed on a glass substrate or as a standalone spacer wafer, may be machined to a desired thickness. In some particular exemplary embodiments, the machining of spacer wafer 62, 73, 75, 92 may be or may include diamond turning. Diamond turning is a process of mechanical machining of precision elements using lathes or derivative machine tools, e.g., turn-mills, rotary transfers, etc., equipped with natural or synthetic diamond-tipped tool bits. The term single-point diamond turning (SPDT) is also commonly used to identify the process. Using diamond turning, spacer wafer 62, 73, 75, 92 can be faced to a desired thickness on a diamond turning lathe. In this form of diamond turning, spacer wafer 62, 73, 75, 92 is mounted on a vacuum chuck and is rotated at some angular velocity, e.g., 1000 RPM. A cutting tool is moved across spacer wafer 62, 73, 75, 92 to face spacer wafer 62, 73, 75, 92 to a desired thickness. If a lower tolerance spacer wafer 62, 73, 75, 92 is desired, the machining can be carried out by common CNC machining methods, such as facing, milling or fly cutting.

According to the present disclosure, spacer wafer 62, 73, 75, 92 need not be machined to a single thickness. That is, spacer wafer 62, 73, 75, 92 can be machined to various thicknesses depending on particular system requirements.

Hence, according to the disclosure, spacer wafer 62, 73, 75, 92 can be manufactured by photolithography and microfabrication techniques then machined to an arbitrary desired thickness.

It is noted that throughout this description and the drawings, the through holes and other features formed in the various spacer wafers fabricated according to the disclosure are shown as being circular holes with straight vertical walls. This feature configuration is exemplary only. According to the disclosure, the features can form any shape selected for the particular application in which spacer wafer 62, 73, 75, 92 is to be used, in addition to or as an alternative to circular features. That is, as described above in detail, photomask features 210, 310 can be defined as circular, square, rectangular, diamond-shaped or with any other arbitrary desired shape such that resulting spacer features 212, 312 will take on these shapes with vertical sidewalls. Also, as described above in detail, features 212, 312 may have non-vertical sidewalls. For example, using gray-tone lithography, the sidewalls of features 212, 312 may be tapered.

Figure 21:
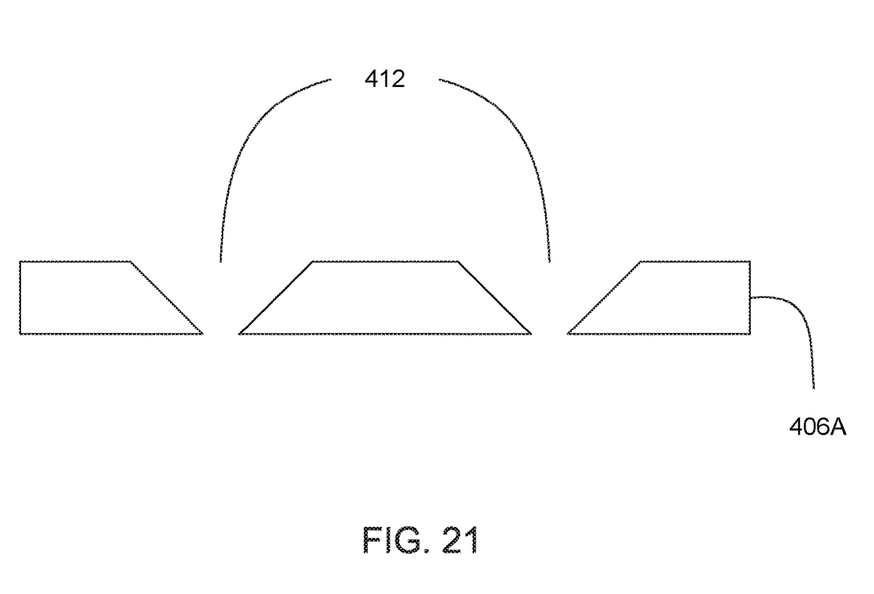
FIG. 21 is a schematic cross-sectional view of a portion of a standalone spacer wafer having through holes with tapered walls, instead of straight vertical walls, according to exemplary embodiments.

FIG. 21 is a schematic cross-sectional view of a portion of a standalone spacer wafer 406A forming through holes 412 with tapered walls, instead of straight vertical walls, according to exemplary embodiments. It should be noted that these embodiments are also applicable to spacer wafers formed on substrates, according to the disclosure, and not only to standalone spacer wafers.

According to the disclosure, spacer wafers 62, 73, 75, 92 can be manufactured without the need for epoxy bonding to glass wafers. Therefore, the disclosure results in reduced equipment time and does not require the use of an epoxy dispense machine and does not require a mask aligner for the bonding step.

According to the disclosure, spacer wafers 62, 73, 75, 92 can be formed on an empty substrate or one with features pre-defined on it. The pre-defined features may be, for example, lenses, fiducial markings, etc.

According to the disclosure, if a spacer material is used which has a lower density than glass, a reduction in weight of the spacer material may be desirable to improve drop test reliability in completed wafer-level cameras.

According to the disclosure, spacer wafers 62, 73, 75, 92 can be manufactured to arbitrary thicknesses. The thickness of spacer wafers 62, 73, 75, 92 of the disclosure can be determined by, among other factors, the thickness of the originally applied photoresist 206, 306 and the process used to apply photoresist 206, 306. Also, photoresist 206A, 306A, 406A used according to the disclosure are machinable and can therefore be machined to any desired thickness for a negligible cost. Depending on the thickness tolerance of spacer wafer 62, 73, 75, 92, traditional or diamond tooling can be used. This is an advantage over glass spacer wafers because they are currently available in 300, 400, 500, 700 and 800 μm standard thicknesses. They are also available in non-standard thicknesses, but the cost of each spacer wafer in non-standard thicknesses would be much higher. These predetermined set standard thicknesses constrain the optical design. The present disclosure provides arbitrary spacer wafer thicknesses for negligible price differences.

The present disclosure also provides spacer wafers 62, 73, 75, 92 that are thinner than 300 μm, which cannot be manufactured using the conventional processes. The need for thinner spacer wafers has been recognized by wafer-level module optical designers to lessen the constraints on their optical designs.

The present disclosure also provides spacer wafers 62, 73, 75, 92 having non-uniform thickness. This is advantageous since a spacer wafer with non-uniform thickness can be used to correct for focus variation that occurs across a lens plate. Measurable focus variations can occur on a lens plate because of non-uniform pressure that is applied while forming lenses, diamond tool wear while creating the master metal mold, or other process effects. These focus variations typically have low spatial frequencies across a lens plate, which can be corrected using this process.

According to the present disclosure, as described above in detail, spacer wafers 62, 73, 75, 92 can be fabricated on both top and bottom surfaces of substrate 200, 300. To that end, after the photolithography and microfabrication processes are completed to fabricate first spacer wafer 62, 73, 75, 92, completed spacer wafer 62, 73, 75, 92 and substrate 200, 300 may be flipped over. Spacer wafer 62, 73, 75, 92 and substrate 200, 300 may then be aligned, and the photolithography and microfabrication processes may be carried out again to fabricate second spacer wafer 62, 73, 75, 92 on the opposite surface of substrate 200, 300.

Combinations of Features

Various features of the present disclosure have been described above in detail. The disclosure covers any and all combinations of any number of the features described herein, unless the description specifically excludes a combination of features. The following examples illustrate some of the combinations of features contemplated and disclosed herein in accordance with this disclosure.

In any of the embodiments described in detail and/or claimed herein, a sacrificial layer may be formed on the substrate before forming the layer of photoresist over the substrate; and after developing the layer of photoresist, the sacrificial layer may be removed, such that the layer of photoresist is a standalone spacer.

In any of the embodiments described in detail and/or claimed herein, the sacrificial layer may comprise polystyrene.

In any of the embodiments described in detail and/or claimed herein, the sacrificial layer may comprise wax.

In any of the embodiments described in detail and/or claimed herein, the photoresist may be negative photoresist.

In any of the embodiments described in detail and/or claimed herein, the photoresist may be epoxy-based photoresist.

In any of the embodiments described in detail and/or claimed herein, the photoresist may be SU-8 photoresist.

In any of the embodiments described in detail and/or claimed herein, a thickness of the spacer wafer may be less than 300 μm.

In any of the embodiments described in detail and/or claimed herein, the layer of photoresist may be machined to a desired thickness.

In any of the embodiments described in detail and/or claimed herein, the layer of photoresist may be machined to a thickness less than 300 μm.

In any of the embodiments described in detail and/or claimed herein, the layer of photoresist may be machined to a plurality of thicknesses.

In any of the embodiments described in detail and/or claimed herein, a mask may be aligned over the layer of photoresist before the layer of photoresist is exposed.

In any of the embodiments described in detail and/or claimed herein, the mask may define at least one hole to be formed in the layer of photoresist.

In any of the embodiments described in detail and/or claimed herein, the hole to be formed in the layer of photoresist may be tapered.

In any of the embodiments described in detail and/or claimed herein, at least one element may be formed in the substrate before forming the layer of photoresist.

In any of the embodiments described in detail and/or claimed herein, the at least one element may comprise a lens.

In any of the embodiments described in detail and/or claimed herein, the at least one element may comprise a fiducial marking.

In any of the embodiments described in detail and/or claimed herein, the substrate may be formed of glass.

In any of the embodiments described in detail and/or claimed herein, an adhesion promoter may be formed over the substrate before forming the layer of photoresist over the substrate.

In any of the embodiments described in detail and/or claimed herein, the layer of photoresist may be formed over a first surface of the substrate, and a second layer of photoresist may be formed over a second surface of the substrate, such that first and second spacer wafers are formed over the first and second surfaces, respectively, of the substrate.

In any of the embodiments described in detail and/or claimed herein, the spacer wafer may have a plurality of thicknesses.

In any of the embodiments described in detail and/or claimed herein, a thickness of the spacer wafer may define a spacing between the at least one element and a second element of the wafer-level camera.

In any of the embodiments described in detail and/or claimed herein, at least one of the first and second elements may be at least one of a lens and a sensor.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A method of manufacturing a spacer wafer for a wafer-level camera, comprising:
    forming a sacrificial layer directly on an adhesion promoter layer formed directly on a top surface of a substrate;
    forming a layer of photoresist over the substrate, such that the sacrificial layer is between the substrate and the layer of photoresist;
    exposing the layer of photoresist to radiation through a mask that defines a pattern of holes and defines a geometry of the spacer wafer;
    developing the layer of photoresist, such that the layer of photoresist is the spacer wafer for the wafer-level camera; and
    after developing the layer of photoresist, removing the sacrificial layer, such that the spacer wafer is a stand-alone spacer.

2. The method of claim 1, wherein the sacrificial layer comprises polystyrene.

3. The method of claim 1, wherein the sacrificial layer comprises wax.

4. The method of claim 1, wherein the photoresist is negative photoresist.

5. The method of claim 1, wherein the photoresist is epoxy-based photoresist.

6. The method of claim 1, wherein a thickness of the spacer wafer is less than 300 μm.

7. The method of claim 1, further comprising machining the layer of photoresist to a desired thickness.

8. The method of claim 7, wherein the layer of photoresist is machined to a thickness less than 300 μm.

9. The method of claim 1, further comprising machining the layer of photoresist to a plurality of thicknesses.

10. The method of claim 1, wherein the substrate is formed of glass.

11. The method of claim 1, wherein:
    the layer of photoresist is formed over a first surface of the substrate; and
    the method further comprises forming a second layer of photoresist over a second surface of the substrate, such that first and second spacer wafers are formed over the first and second surfaces, respectively, of the substrate.

* * * * *